(12) United States Patent
Meng et al.

(10) Patent No.: US 10,547,103 B2
(45) Date of Patent: Jan. 28, 2020

(54) SIZE-ADJUSTABLE ANTENNA GROUND PLATE

(71) Applicant: TOYOTA MOTOR ENGINEERING & MANUFACTURING NORTH AMERICA, INC., Erlanger, KY (US)

(72) Inventors: Ming Michael Meng, Novi, MI (US); Lloyd Allen Dunlap, Brighton, MI (US)

(73) Assignee: TOYOTA MOTOR ENGINEERING & MANUFACTURING NORTH AMERICA, INC., Erlanger, KY (US)

( * ) Notice: Subject to any disclaimer, the term of this patent is extended or adjusted under 35 U.S.C. 154(b) by 110 days.

(21) Appl. No.: 15/427,560

(22) Filed: Feb. 8, 2017

(65) Prior Publication Data

US 2018/0175490 A1   Jun. 21, 2018

Related U.S. Application Data

(60) Provisional application No. 62/435,893, filed on Dec. 19, 2016.

(51) Int. Cl.
| | |
|---|---|
| *H01Q 1/48* | (2006.01) |
| *G01R 29/08* | (2006.01) |
| *H01Q 1/32* | (2006.01) |
| *H04B 17/10* | (2015.01) |

(52) U.S. Cl.
CPC .......... *H01Q 1/48* (2013.01); *G01R 29/0821* (2013.01); *H01Q 1/32* (2013.01); *H04B 17/102* (2015.01)

(58) Field of Classification Search
CPC ........ H01Q 1/48; H01Q 3/267; G01R 31/001; G01R 31/006; G01R 33/56383; G01R 31/31701; G01R 31/31903; H04B 17/16
See application file for complete search history.

(56) References Cited

U.S. PATENT DOCUMENTS

| | | | |
|---|---|---|---|
| 7,385,555 B2 | 6/2008 | Mahmoud et al. | |
| 7,512,430 B2* | 3/2009 | Nakamura | G01R 29/0821 343/702 |
| 2005/0206568 A1* | 9/2005 | Phillips | H01Q 9/0414 343/700 MS |
| 2006/0244667 A1* | 11/2006 | Thompson | H01Q 1/3275 343/713 |

(Continued)

FOREIGN PATENT DOCUMENTS

| | | |
|---|---|---|
| JP | 9-181525 A | 7/1997 |
| WO | WO 2016/002162 A1 | 1/2016 |
| WO | WO 2016/092794 A1 | 6/2016 |

*Primary Examiner* — Ricardo I Magallanes
(74) *Attorney, Agent, or Firm* — Oblon, McClelland, Maier & Neustadt, L.L.P.

(57) ABSTRACT

Aspects of the disclosure provide an antenna ground plate for testing an antenna. A size of the antenna ground plate can be conveniently adjusted according to requirements of an antenna testing process. The antenna ground plate can include a base plate that provides a ground plane for the antenna, and a first extension plate releasably attachable to the base plate to extend the ground plane of the antenna. The base plate and first extension plate can be made of conductive materials. The base plate can include a mounting hole at the center of the base plate for mounting the antenna under test. The first extension plate can be attachable to an outer edge of the base plate.

20 Claims, 5 Drawing Sheets

(56) References Cited

U.S. PATENT DOCUMENTS

| | | |
|---|---|---|
| 2013/0278467 A1 | 10/2013 | Dassano et al. |
| 2015/0061964 A1 | 3/2015 | Sugimoto et al. |
| 2015/0346267 A1* | 12/2015 | Fukasawa .............. G01R 35/00 324/520 |
| 2015/0357714 A1 | 12/2015 | Ng et al. |
| 2016/0211573 A1* | 7/2016 | Gardner ............... H01Q 1/3275 |
| 2016/0252621 A1* | 9/2016 | Astakhov ................ H01Q 1/48 342/357.61 |
| 2018/0109332 A1* | 4/2018 | Baar ................... H04B 17/102 |

* cited by examiner

SIZE-ADJUSTABLE ANTENNA GROUND PLATE

INCORPORATION BY REFERENCE

This present disclosure claims the benefit of U.S. Provisional Application No. 62/435,893, "Size-Adjustable Antenna Ground Plate" filed on Dec. 19, 2016, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Multiple antenna elements are needed for various on-vehicle services. For example, a vehicle may carry systems for satellite-based navigation, satellite radio, AM/FM radio, mobile communication network communications and other types of services. Those different systems may need different antennas to receive or transmit wireless signals. The U.S. Pat. No. 9,178,272 disclosed a vehicle-roof-mounted multiband shark fin antenna that may include multiple receiving or transmitting antenna elements.

On-vehicle antennas can be mounted on an outer surface of a vehicle roof. The conductive roof or other planar surfaces of the vehicle can serve as a ground plane for the antennas. For some types of antennas, increasing the size of the ground plane can improves performance of the antenna.

During an antenna design process, antennas are evaluated and tested in the field or in a controlled environment to determine or optimize design parameters. A size of an antenna ground plane may need to be varied for conducting the evaluation or test operations.

SUMMARY

Aspects of the disclosure provide an antenna ground plate for testing an antenna. A size of the antenna ground plate can be conveniently adjusted according to requirements of an antenna testing process. The antenna ground plate can include a base plate that provides a ground plane for the antenna, and a first extension plate releasably attachable to the base plate to extend the ground plane of the antenna. The base plate and first extension plate can be made of conductive materials. The base plate can include a mounting hole at the center of the base plate for mounting the antenna under test. The first extension plate can be attachable to an outer edge of the base plate.

In one embodiment, the antenna ground plate includes multiple first extension plates releasably attachable to the base plate to extend the ground plane of the antenna at all directions from the base plate. In one example, the antenna ground plate includes rectangular first extension plates attachable to edges of the base plate to extend the ground plane of the antenna.

In one example, the first extension plate has an opening at the center of the first extension plate and is attachable to the base plate from above the base plate with the antenna inside the opening. In various examples, the first extension plate can have one of the following shapes: a square shape, a rectangular shape, a circular shape, and a regular-polygon shape. In one example, the base plate includes a magnet attached to a lower surface of the base plate to mount the base plate to a vehicle roof. In various examples, the first extension plate can be attached to the base plate by various fastening devices, such as a bolt, a screw, a magnet, a snap joint, and the like.

In some embodiments, the antenna ground plate further includes a second extension plate releasably attachable to the first extension plate to further extend the ground plane of the antenna. In one example, the first extension plate is releasably attachable to an outer edge of the base plate, and the second extension plate is releasably attachable to an outer edge of the first extension plate with respect to a center of the base ground plate. In one example, the antenna ground plate includes multiple first extension plates releasably attachable to the base plate to extend the ground plane of the antenna at all directions from the base plate, and multiple second extension plates releasably attachable to the multiple first extension plates to further extend the ground plane of the antenna at all directions from the base plate.

In one example, a first extension plate has a first opening at the center of the first extension plate and is releasably attachable to a base plate from above the base plate with the antenna inside the first opening, and a second extension plate has a second opening at the center of the second extension plate larger than the first opening and is releasably attachable to the first extension plate from above the first extension plate with the antenna inside the second opening.

In one embodiment, the antenna ground plate includes a first extension plate and a second extension plate both of which can be releasably attached to the base plate to extend the ground plane of the antenna, but have different sizes.

The antenna under test can be a vehicle roof mounted antenna. The antenna can include at least one transmitting or receiving antenna element of the following antenna elements: an AM/FM antenna, a mobile phone antenna, a remote keyless entry (RKE) antenna, a satellite positioning system antenna, a satellite radio antenna, a stacked patch antenna, a digital audio broadcasting (DAB) antenna, a wireless LAN (WLAN) antenna, and a worldwide interoperability for microwave access (WiMAX) antenna.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1A:
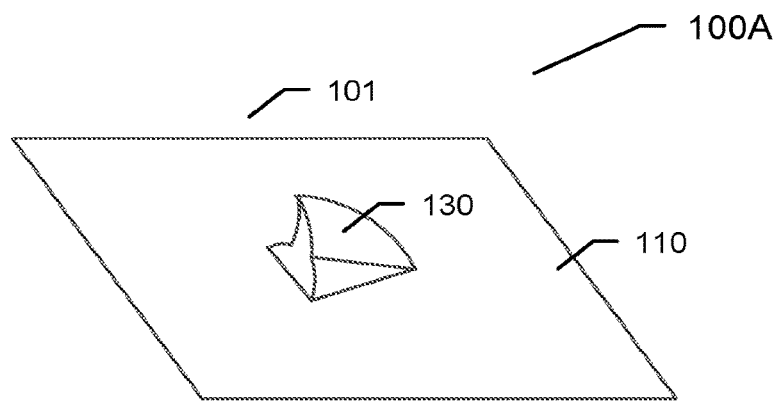
FIGS. 1A and 1B show perspective views of two different test settings for testing an antenna according to an embodiment of the disclosure.
Figure 1B:
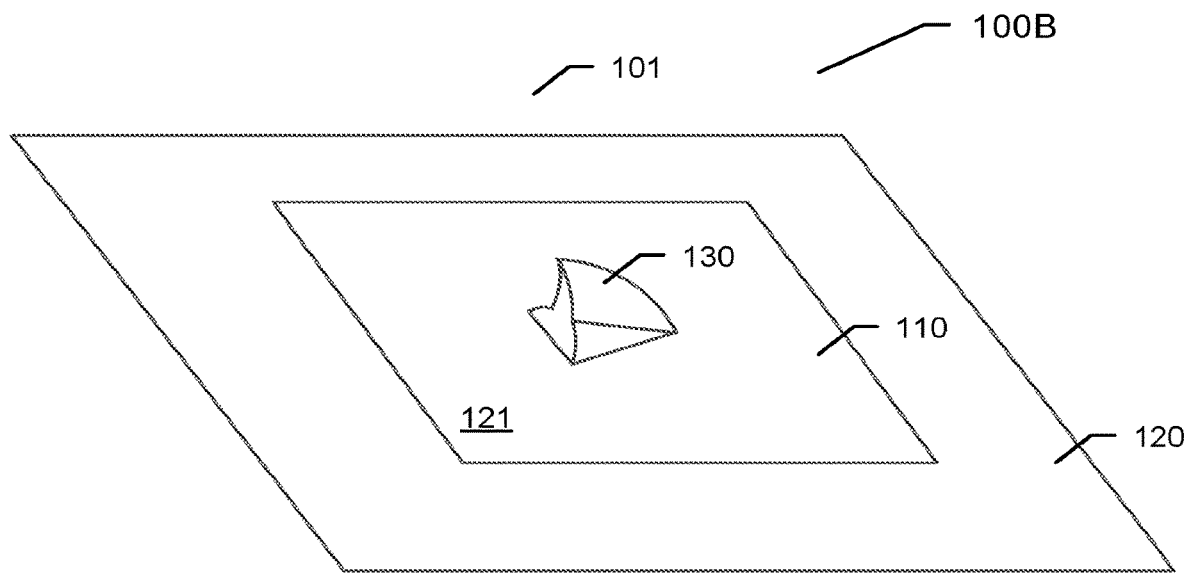

FIGS. 1A and 1B show perspective views of two different test settings 100A and 100B, respectively, for testing an antenna 130 according to an embodiment of the disclosure. In one example, the antenna 130 under test is a shark fin shaped vehicle top-mounted antenna. In the test settings 100A/100B, a size adjustable antenna ground plate 101 is used for providing an antenna ground plane for the antenna 130 under test during an antenna testing process. The antenna ground plate 101 includes a base plate 110 and an extension plate 120. The antenna 130 under test is attached to the base plate 101. The antenna ground plate 100 can be, for example, mounted on a roof of a vehicle during a field test process.

The size of the antenna ground plate 100 can be changed according to requirements of the antenna testing process. As shown, in the first testing setting 100A in FIG. 1A, only the base antenna plate 110 is used for providing an antenna ground plane when a smaller ground plane is required. In contrast, in the second test setting 100B in FIG. 1B, when a larger ground plane is required, the extension plate 120 can be attached to the base plate 110 to provide an extended ground plane for the testing. Thus, the antenna ground plate 101 provides flexibility for adjusting the size of the ground plane of the antenna 130 under test during an antenna testing process.

Antenna evaluation or testing can be conducted in the field or in a controlled environment. For example, during a field test, an antenna may be carried on a vehicle travelling on a specific route to measure certain parameters while receiving wireless signals from cellular towers or radio broad casting towers. Alternatively, an antenna may be disposed on various spots on the surface of the earth for testing satellite signal reception. In other examples, during a test in a controlled environment, an anechoic chamber may be employed. For example, a transmitting antenna is used to as a source to illuminate an antenna under test. The antenna under test can be placed on a positioning system rotating the antenna under test relative to the source antenna. Radiation pattern of the antenna under test as a function of angle can thus be measured. Multiple parameters, such as radiation pattern, antenna gain, impedance, bandwidth, polarization and the like, can be measured during an antenna testing process.

When testing a certain antenna design during an antenna testing process, antenna ground planes with varied sizes may be required. For example, there are various types of antennas that can be included in a vehicle mounted antenna such as the shark fin shaped antenna 130. Some types of antennas rely on a conductive portion of a vehicle body to act as an antenna ground plane in order to operate properly. For example, dipole antennas, helical antennas, patch antennas, and the like, are broadly used in vehicle top mounted antennas. Those types of antennas need, for example, a conductive roof, to provide a ground plane to enable their functions. For various antenna designs, an antenna ground plane can either be a fundamental part of an antenna, or strengthen an antenna's performance when provided. For a certain antenna design, an antenna ground plane having a size below a required size would cause malfunction in the antenna. Thus, a desired size of the antenna ground plane needs to be studied and tested. In order to do so, antenna ground planes with varied sizes need to be provided during the test process.

In addition, ground planes with different sizes need to be provided when testing different antenna elements that operate in different frequency bands. A vehicle top mounted antenna may include multiple antenna elements for various in-vehicle services. For example, the antenna 130 may include an AM/FM antenna, a mobile phone antenna, a remote keyless entry (RKE) antenna, a satellite positioning system antenna, a satellite radio antenna, a stacked patch antenna, a digital audio broadcasting (DAB) antenna, a wireless LAN (WLAN) antenna, and a worldwide interoperability for microwave access (WiMAX) antenna. Those antenna elements may operate at different frequency bands. Typically, a size of an antenna ground plane required for an antenna to operate properly is proportional to wave lengths of frequencies within the operating frequency band of the antenna. Accordingly, different antenna elements may require antenna ground planes with different sizes. For example, a GPS antenna may operate at a frequency around 2.5 GHz and have a corresponding operating wavelength of about 1.2 centimeters, while a LTE cellular antenna may operate at 700 MHz and have a corresponding operating wavelength of about 40 centimeters. Accordingly, the LTE cellular antenna may require an antenna ground plane larger than the GPS antenna. When testing an antenna including multi-band antenna elements, ground planes with different sizes may thus be required for testing different antenna elements.

According to the disclosure, the size-adjustable antenna ground plate 101 can provide flexibility for changing a size of an antenna ground plane during an antenna test process. When a ground plane with a smaller size is needed, the base plate 110 can be used, while when a ground plane with a larger size is needed, the base plate 110 and the extension plate 120 together can be used.

In FIGS. 1A and 1B, the base plate 110 is rectangular-shaped, and the extension plate 120 has an opening 121 in the middle of the extension plate 120 that is also rectangular-shaped. The size of the opening 121 is slightly smaller than the base plate 110 such that the base plate 110 can cover the opening 121 when the extension plate 120 is attached to the base plate 110 either from above the base plate 110 or from bellow.

In various embodiments, a size-adjustable antenna ground plate, such as the antenna ground plate 101, can have a base plate and more than one extension plates which can be combined together to gradually expand or reduce a ground plane for an antenna under test. Sizes of the base plate and extension plates can vary in various embodiments. For example, a base plate having a square shape can have a side length in a range from 3 centimeters to 40 centimeters. The minimum size can be determined based on the highest operation frequency of a certain antenna under test. A size of an extension plate determines a size of an extended area of a ground plane when attaching this extension plate to a base plate.

In addition, shapes of base plates and extension plates can vary for different embodiments, and can be any suitable shapes. For example, shapes of the extended ground planes can be circular, rectangular, oval, square, or any types of regular or irregular polygons. In some examples, shapes of extension plates of a size-adjustable antenna ground plate can be different from each other, or from a base plate of the same ground plate.

Extension plates or base plates of size-adjustable antenna ground plates can be made of any suitable conductive materials, such as metals, alloys, and the like. Thickness of extension plates or base plates can vary depending on testing requirements. For example, thickness of a base plate or extension plate may be in the rage of 1 millimeter to 3 millimeters.

Various fastening means can be employed to join an additional extension plate to a base plate or an extended plate. For example, magnets, screws, bolts, snap joints, and any other connectors can be used to fasten an additional extension plate.

In one example, an antenna evaluation process is performed in an anechoic chamber to measure various parameters of a vehicle roof mounted antenna. The antenna under test may include antenna elements for different services, for example, a GPS antenna for satellite navigation operating at 2.4 GHz, a LTE cellular network antenna for mobile phone calls operating at 700 MHz and 1700 MHz, an FM antenna for radio reception operating on a range of 88 MHz to 108 MHz. Thus, when testing for these antenna elements, antenna ground planes with different sizes may be needed. Accordingly, a size-adjustable ground plate can be employed. By combination of different number of extension plates, antenna ground planes with required sizes can be provided.

Figure 2A:
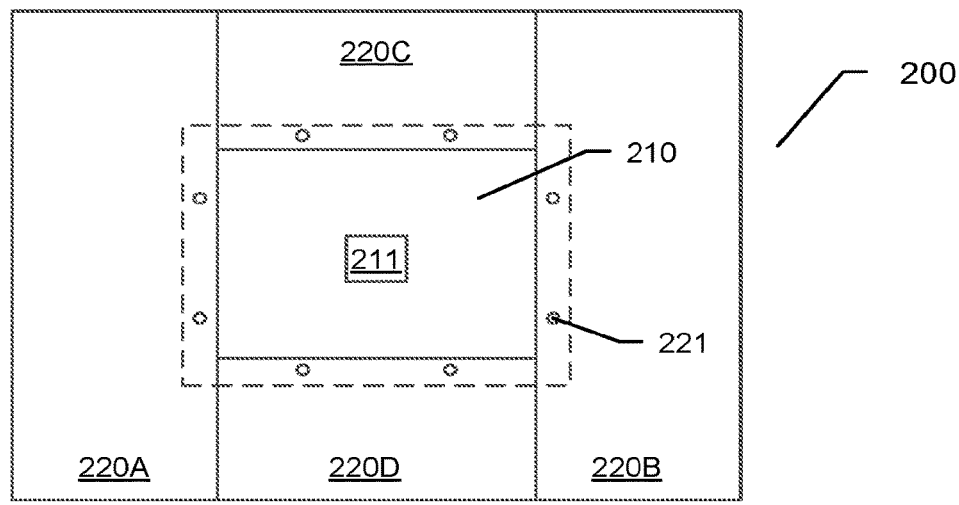
FIG. 2A shows an example of a size-adjustable antenna ground plate according to an embodiment of the disclosure.

FIG. 2A shows an example of a size-adjustable antenna ground plate 200 according to an embodiment of the disclosure. The ground plate 200 includes a base plate 210, and four pieces of extension plates 220A-220D. The base plate 210 and the extension plates 220A-220D can be arranged in a way shown in FIG. 2A to form an extended antenna ground plate. The base plate 210 is rectangular shaped with a mounting hole 211 created at the center of the base plate 210. The mounting hole 211 can be used to fix an antenna under test to the base plate 210. The four extension plates 220A-220D are also of a regular shape and are each attached to one of four edges of the base plate 210. As a result, the attached extension plates 220A-220D are pieced together to form an extension area overlapping the base plate 210. Holes 221 are created near each edges of the base plate 210 on both the base plate 210 and the four extension plate 220 for joining the base plate 210 and the extension plate 220. In one example, bolts are used with each hole 221 to join the extension plate 220 to the base plate 210.

It is noted that other type of fastening means may be used instead of bolts. Accordingly, the ground plate 200 may not include a hole 221. For example, suitable magnets can be embedded into the base plate 210 or the extension plates 220A-220D at suitable locations, for example, near the positions of the holes 221. As a result, the extension plates 220A-220D can be conveniently attached to or removed from the base plate 210.

Figure 2B:
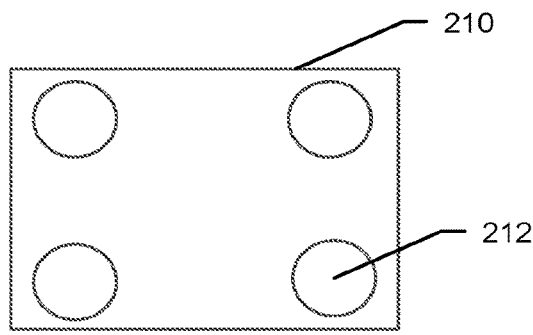
FIG. 2B shows a base plate with mounting magnets according to an example.

FIG. 2B shows the base plate 210 with mounting magnets 212 according to an example. The mounting magnets 212 are attached to a surface of the base plate 210 opposite to the surface where the extension plates 220A-220D are attached. The mounting magnets 212 can be used, for example, to attach an antenna under test and the joined ground plate 200 to a positioning system in an anechoic chamber, or to a roof of a vehicle for a field testing. When used with a vehicle, the magnets 212 provide convenience for moving the antenna under test to different positions on the roof. In this way, different test conditions can be created without damaging the roof or headliners.

Figure 3:
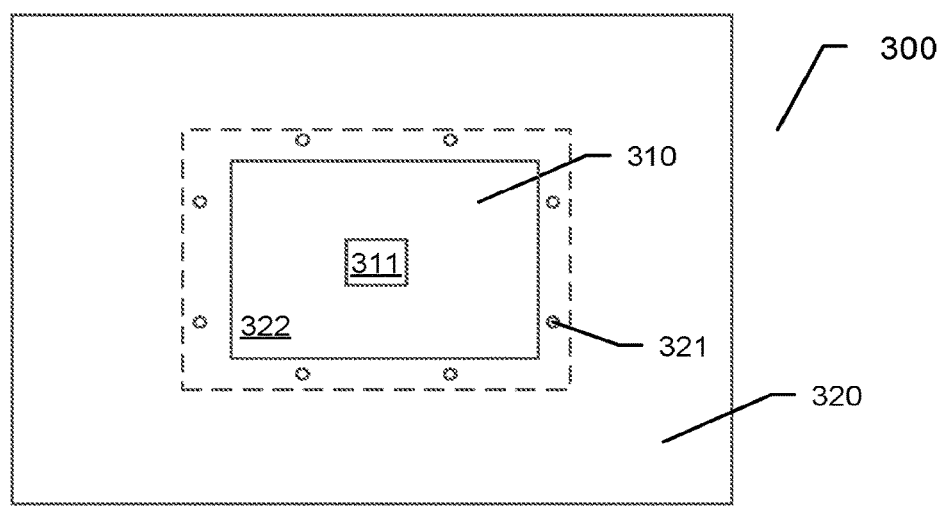
FIG. 3 shows another example of a size-adjustable antenna ground plate according to an embodiment of the disclosure.

FIG. 3 shows another example of a size-adjustable antenna ground plate 300 according to an embodiment of the disclosure. In this example, the antenna ground plate 300 has a base plate 310 and an extension plate 320 that can be joined together with bolts at multiple fastening holes 321. The base plate 310 is rectangle-shaped with a mounting hole 311 at the center of the base plate 310 for mounting an antenna under test. The extension plate 320 is also rectangle-shaped with a rectangular opening 322 in the middle of the extension plate 320. The antenna ground plate 300 is similar to the antenna ground plate 200 in FIG. 2A, however, different from the FIG. 2A example, the extension plate 320 is made of a single piece instead of four separated pieces 220A-220D.

Figure 4A:
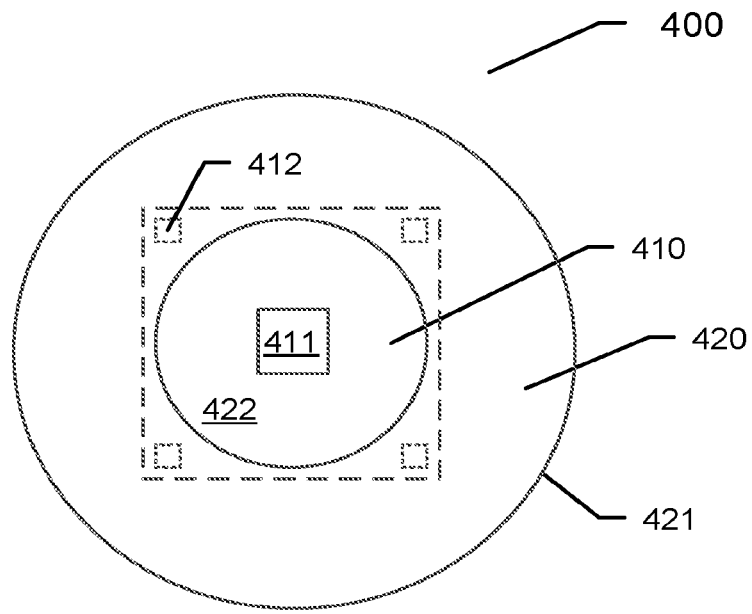
FIGS. 4A and 4B show a further example of a size-adjustable antenna ground plate according to an embodiment of the disclosure.
Figure 4B:
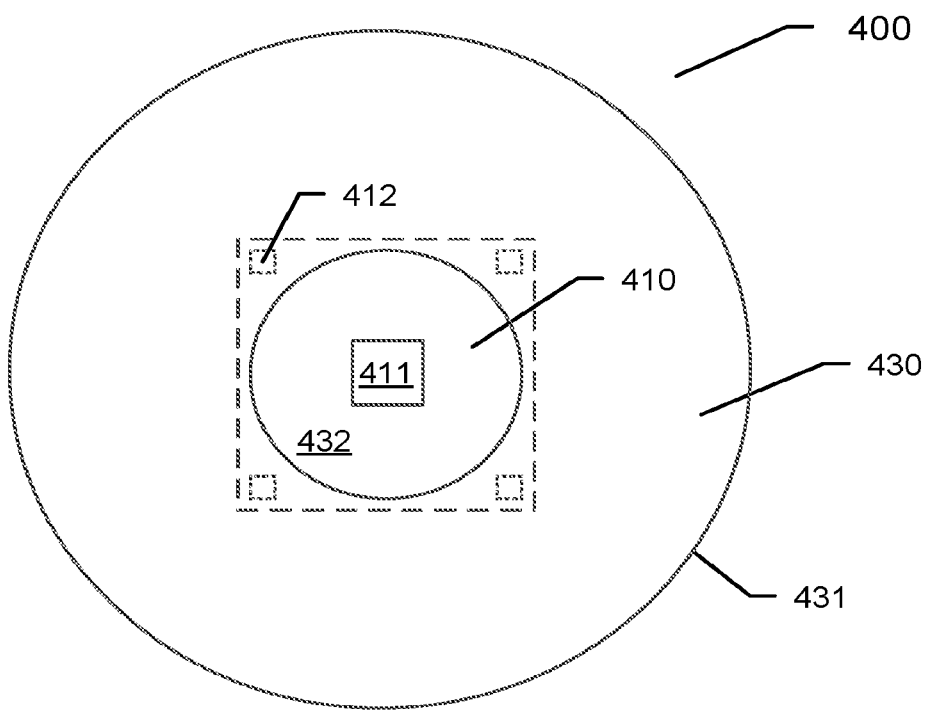

FIGS. 4A and 4B shows a further example of a size-adjustable antenna ground plate 400 according to an embodiment of the disclosure. In this example, the antenna ground plate 400 includes a square-shaped base plate 410 and two ring-shaped extension plates 420 and 430 with different sizes. Either one of the two ring-shaped extension plates 420 and 430 can be attached to the square-shaped base plate 410 to form an extended ground plate as shown in FIG. 4A or 4B. As shown, the extension plate 420 is smaller than the extension plate 430 in terms of radius of outer edges 421 and 431, but the two extension plates 420 and 430 have openings 422 and 432 with a same size. During an antenna test process, the two extension plate 420 and 430 can be exchanged to reduce or increase a size of the ground plate 400. In addition, the base plate 410 can include an antenna mounting hole 411, and magnets 412 embedded or attached to the base plate 410, for example, at each corner of the base plate 410 for joining the extension plate 420 or 430 to the base plate 410.

Figure 5:
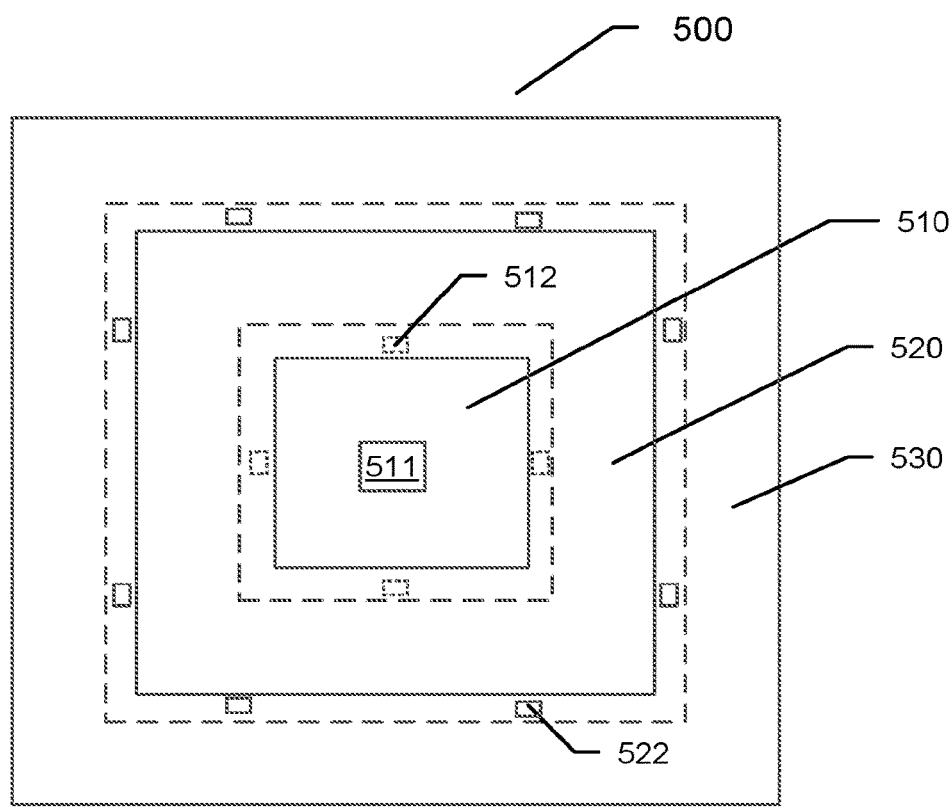
FIG. 5 shows an example of a size-adjustable antenna ground plate according to an embodiment of the disclosure.

FIG. 5 shows an example of a size-adjustable antenna ground plate 500 according to an embodiment of the disclosure. The ground plate 500 has a base plate 500 and two extension plate 520 and 530. The base plate 500 is square-shaped with an antenna mounting hole 511 at the center of the base plate. The two extension plates 520 and 530 are both square-shaped with a square-shaped opening in the middle, but have different sizes. During an antenna test process, the extension plate 520 can be disposed over the base plate 510, and the extension plate 530 can then be disposed over the extension plate 520. In this way, as shown in FIG. 5, an extended ground plate can be formed. When a smaller ground plate is needed, the extension plate 530 or both extension plates 520 and 530 can be removed from the extended ground plate to obtain a smaller size.

In one example, mounting magnets 512 and 522 are used for joining the extension plates 520 or 530. Specifically, the base plate 510 can have mounting magnets 512 embedded or attached near edges of the base plate 510 as shown in FIG. 5. Similarly, the base plate 520 can have mounting magnets 512 embedded or attached near edges of the base plate 520 as shown in FIG. 5. Usage of the magnets 512 and 522 enable the extension plates 520 or 510 to be conveniently attached or removed from a ground plate to extend or contract the ground plate.

Figure 6:
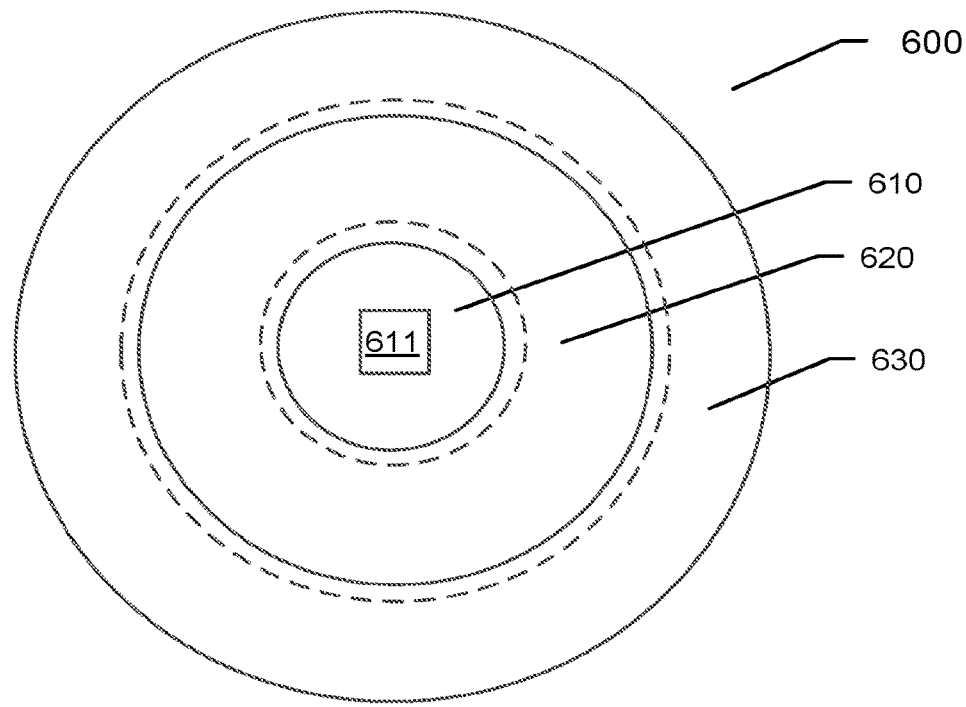
FIG. 6 shows another example of a size-adjustable antenna ground plate according to an embodiment of the disclosure.

FIG. 6 shows another example of a size-adjustable antenna ground plate 600 according to an embodiment of the disclosure. The ground plate 600 includes a base plate 610 and two extension plates 620 and 630. The ground plate 600 is circular shaped, while the two extension plates 620 and 630 are also circular-shaped but with circular openings in the middle. As shown, the two extension plates 620 and 630 are configured with suitable sizes, such that the extension plate 620 can be disposed to overlap the base plate 610, and the extension plate 630 in turn to overlap the extension plate 620, to form an extended ground plate. The base plate 610 may include an antenna mounting hole 611. Any suitable fastening means, such as bolts, screws, magnets, snap joints, and the like, can be used to attach the extension plates 620 or 630, although not shown in FIG. 6.

Figure 7:
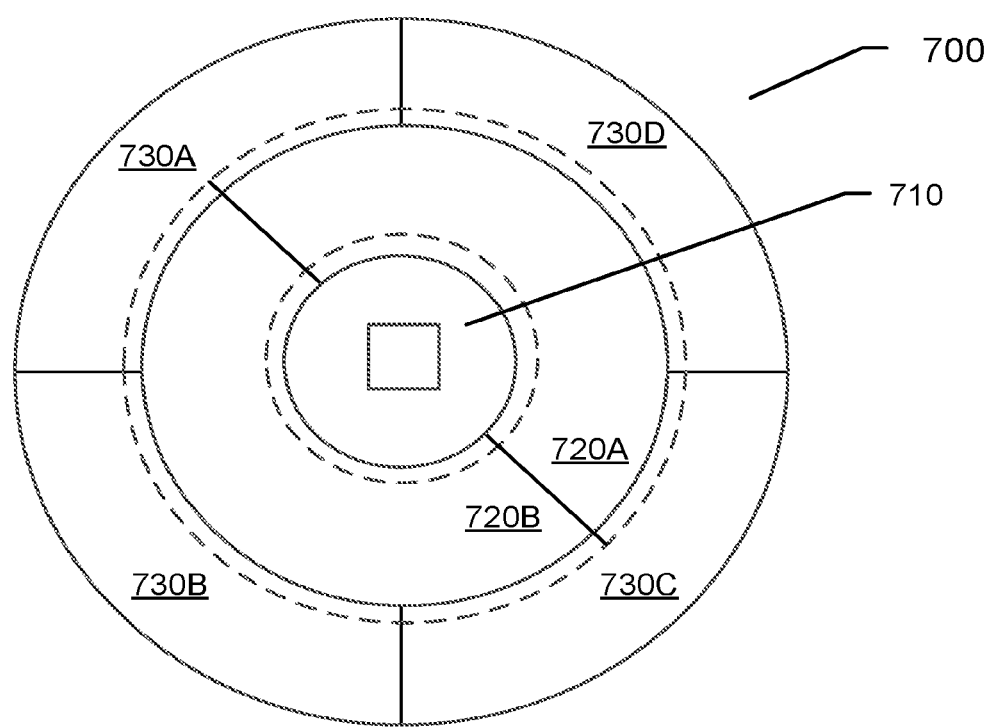
FIG. 7 shows a further example of a size-adjustable antenna ground plate according to an embodiment of the disclosure.

FIG. 7 shows a further example of a size-adjustable antenna ground plate 700 according to an embodiment of the disclosure. The ground plate 700 includes a base plate 710, a first group of extension plates 720A and 720B, and a second group of extension plates 730A-730D. The base plate 710 is circular-shaped. The extension plates 720A and 720B can be pieced together to form a first ring-shaped plate, while the extension plates 730A-730B can be pieced together to form a second ring-shaped plate. As shown, the base plate 710 and the extension plates 720A/720B/730A-730B can be joined together to form an extended ground plate. In contrast to the FIG. 6 example, a single piece plate, such as the extension plate 630, is separated into four pieces 730A-730B in FIG. 7. In this way, sizes of extension plates can be reduced making it easier to store or carry the extension plates.

It is noted that although only limited number of extension plates are shown in one size-adjustable antenna ground plate in above examples, any number of additional extension plates can be employed and added to an extended ground plate for further expanding a ground plate.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An antenna ground plate for testing an antenna, comprising:
    a base plate that provides a ground plane for the antenna; and
    a first extension plate releasably attachable to the base plate to extend the ground plane of the antenna, the first extension plate being disposed in a same plane as the base plate, wherein
    the antenna ground plate is separate from the antenna, and
    the antenna ground plate is a modular testing device that is structured for different antenna tests, such that when the base plate is connected to the antenna with the first extension plate released from the base plate, the antenna ground plate is structured for a first antenna test, and when the base plate is connected to the antenna with the first extension plate attached to the base plate, the antenna ground plate is structured for a second antenna test that is different from the first antenna test.

2. The antenna ground plate of claim 1, wherein the base plate and first extension plate are made of conductive materials.

3. The antenna ground plate of claim 1, wherein the base plate includes a mounting hole at the center of the base plate for mounting the antenna.

4. The antenna ground plate of claim 1, wherein the first extension plate is attachable to an outer edge of the base plate.

5. The antenna ground plate of claim 1, comprising multiple first extension plates releasably attachable to the base plate to extend the ground plane of the antenna at all directions from the base plate.

6. The antenna ground plate of claim 5, comprising rectangular first extension plates, wherein the rectangular first extension plates are attachable to edges of the base plate to extend the ground plane of the antenna.

7. The antenna ground plate of claim 1, wherein the first extension plate has an opening at the center of the first extension plate and is attachable to the base plate from above the base plate with the antenna inside the opening.

8. The antenna ground plate of claim 7, wherein the first extension plate has one of the following shapes: a square shape, a rectangular shape, a circular shape, and a regular-polygon shape.

9. The antenna ground plate of claim 1, wherein the base plate includes a magnet attached to a lower surface of the base plate to mount the base plate to a vehicle roof.

10. The antenna ground plate of claim 1, wherein the first extension plate is attached to the base plate by one of the flowing fastening devices: a bolt, a screw, a magnet, and a snap joint.

11. The antenna ground plate of claim 1, further comprising a second extension plate releasably attachable to the first extension plate to further extend the ground plane of the antenna.

12. The antenna ground plate of claim 11, wherein the first extension plate is releasably attachable to an outer edge of the base plate, and the second extension plate is releasably attachable to an outer edge of the first extension plate with respect to a center of the base ground plate.

13. The antenna ground plate of claim 11, comprising multiple first extension plates releasably attachable to the base plate to extend the ground plane of the antenna at all directions from the base plate, and multiple second extension plates releasably attachable to the multiple first extension plates to further extend the ground plane of the antenna at all directions from the base plate.

14. The antenna ground plate of claim 11, wherein the first extension plate has a first opening at the center of the first extension plate and is releasably attachable to the base plate from above the base plate with the antenna inside the first opening, and the second extension plate has a second opening at the center of the second extension plate larger than the first opening and is releasably attachable to the first extension plate from above the first extension plate with the antenna inside the second opening.

15. The antenna ground plate of claim 11, wherein the first and second extension plates are of one of the following shapes: a square shape, a rectangular shape and a circular shape.

16. The antenna ground plate of claim 11, wherein the base plate includes a magnet attached to a lower surface of the base plate for mounting the base plate to a vehicle roof.

17. The antenna ground plate of claim 11, wherein the first extension plate and the second extension plate are attachable to the base plate or the first extension plate, respectively, by one of the flowing fastening devices: a bolt, a screw, a magnet, and a snap joint.

18. The antenna ground plate of claim 1, further comprising a second extension plate releasably attachable to the base plate to extend the ground plane of the antenna and having a size different from the first extension plate.

19. The antenna ground plate of claim 1, wherein the antenna is a vehicle roof mounted antenna.

20. The antenna ground plate of claim 1, wherein the antenna includes at least one transmitting or receiving antenna element of the following antenna elements: an AM/FM antenna, a mobile phone antenna, a remote keyless entry (RKE) antenna, a satellite positioning system antenna, a satellite radio antenna, a stacked patch antenna, a digital audio broadcasting (DAB) antenna, a wireless LAN (WLAN) antenna, and a worldwide interoperability for microwave access (WiMAX) antenna.

* * * * *